United States Patent [19]

Chen

[11] Patent Number: 4,534,824
[45] Date of Patent: Aug. 13, 1985

[54] PROCESS FOR FORMING ISOLATION SLOTS HAVING IMMUNITY TO SURFACE INVERSION

[75] Inventor: Pau-Ling Chen, San Jose, Calif.

[73] Assignee: Advanced Micro Devices, Inc., Sunnyvale, Calif.

[21] Appl. No.: 600,911

[22] Filed: Apr. 16, 1984

[51] Int. Cl.$^3$ .................. H01L 21/306; B44C 1/22; C03C 15/00; C03C 25/06

[52] U.S. Cl. .................. 156/628; 29/576 W; 29/580; 148/187; 156/643; 156/648; 156/653; 156/662; 357/47

[58] Field of Search ............ 156/628, 643, 648, 653, 156/657, 659.1, 662; 29/576 W, 580; 427/93; 148/1.5, 187; 357/47, 49, 50

[56] References Cited

U.S. PATENT DOCUMENTS

| 4,272,302 | 6/1981 | Jhabvala | 156/648 X |
| 4,307,180 | 12/1981 | Pogge | 430/314 |
| 4,331,708 | 5/1982 | Hunter | 156/657 X |
| 4,333,227 | 6/1982 | Horng et al. | 29/580 |
| 4,369,565 | 1/1983 | Muramatsu | 29/580 |

OTHER PUBLICATIONS

Wang et al., "Reactive-Ion Etching Eases Restrictions on Material and Feature Sizes", *Electronics*, Nov. 3, 1983, pp. 157, 159.
Kendall, "Vertical Etching of Silicon at Very High Aspect Ratios", *Annual Review of Materials Science*, 1979, vol. 9, pp. 373-403.
Lahmann et al., "Dry Etching for Pattern Transfer", *J. Vacuum Science and Technology*, vol. 17, No. 5, Sep.-/Oct. 1980, pp. 1177-1183.
Eprath, "Reactive Ion Etching for VLSI", *IEEE Transactions on Electron Devices*, vol. ED-28, No. 11, Nov. 1981, p. 1315.
Gregory et al., "Latch-Up in CMOS Integrated Circuits", *IEEE Transactions on Nuclear Science*, vol. NS20, pp. 293, 299, (1973).
"New Way Proposed to End Latchup", *Electronics*, Feb. 29, 1984, p. 54.
Chiang et al., "Trench Isolation Technology for MOS Applications", Extended Abstracts, Electromechanical Society Meeting, Oct. 1982, p. 276.
Magdo, "T" Trench Recessed Oxide Isolation Scheme, *IBM Technical Disclosure Bulletin*, vol. 24, No. 7B, Dec. 1981, pp. 3841-3843.

*Primary Examiner*—William A. Powell
*Attorney, Agent, or Firm*—Patrick T. King; Eugene H. Valet; Mark A. Haynes

[57] ABSTRACT

A process for forming isolation slots having immunity to surface inversion comprises the steps of defining a slot region in a semiconductor substrate, implanting dopants in the substrate adjacent the mouth of the slot which have conductivity types appropriate to counteract inversion across the filled slot, applying a spacer layer over the exposed surface of the layers defining the slot and over the substrate, etching the spacer layer to leave spacers only along the edges of the materials defining the slots and etching the substrate to form the slots.

6 Claims, 29 Drawing Figures

PROCESS FOR FORMING ISOLATION SLOTS HAVING IMMUNITY TO SURFACE INVERSION

BACKGROUND OF THE INVENTION

1. Field of the Invention

This invention relates to a process for forming slots for isolating active regions in an integrated circuit and, more particularly, relates to a process for forming slots which have an immunity to inversion across the mouth of the slot after it is filled.

2. Discussion of Background and Prior Art

The use of slots, also known as trenches or grooves, is becoming more common in isolating individual devices within an integrated circuit. For certain applications, such slots or trenches will be replacing the traditional approaches of pn junction isolation and oxide isolation. See, e.g., D. N. K. Wang et al., "Reactive-Ion Etching Eases Restrictions on Materials and Feature Sizes", *Electronics*, Nov. 3, 1983, pp. 157, 159.

The traditional technique for fabricating slots, the so-called cut-and-fill technique, has generally not been widely implemented in the semiconductor industry because it has utilized chemical etches which etch the silicon along specified crystallographic planes. Except for special crystallographic orientations not readily obtainable in conventional device processing, the shape of the etched regions tends to be a V with a high ratio of lateral spacing to depth. This has not been particularly suitable for high level integration in integrated circuits. Also, while it has been possible with the above-mentioned special crystallographic orientations along with careful masking and etching to fabricate long, narrow grooves in silicon wafers, it has not been possible by chemical means alone to produce arbitrary shapes or small holes. The direction of etching follows the orientation of the crystal axes so that arbitrary shapes are not possible. See, e.g., D. L. Kendall, "Vertical Etching of Silicon At Very High Aspect Ratios", *Annual Review of Materials Science*, 1979, v. 9, pp. 373–403.

The increasing use of slots or trenches as discussed above is due principally to the availability of physical etching equipment such as reactive-ion etch equipment supplied by companies such as Anelva, ETS, Varian and others. Since the ion beams or plasma action is directed, anisotropic etching is inherent and therefore the etching of arbitrary shapes is possible. Reactive species such as $SF_6$, $CCl_2F_2$ or $CCl_4$ are used in the beams so that the benefits and effects of both physical and chemical etching may be obtained. There has also been a growing use of selective etchants in semiconductor fabrication processes to produce structural features without having to use additional masking steps. See, e.g., H. W. Lehmann et al., "Dry Etching For Pattern Transfer", *J. Vacuum Science and Technology*, v. 17, No. 5, September/October 1980, pp. 1177; and L. M. Ephrath, "Reactive Ion Etching for VLSI", *IEEE Transactions on Electron Devices*, v. Ed-28, No. 11, November 1981, p. 1315. In practice these equipments and techniques are used to form slots which are then filled with a suitable filler material in order to produce structural integrity. Filling is accomplished either by flowing the material into the slot or by depositing a film within a slot by isotropic film processes. Finally, the slot-containing substrates are planarized and serve as isolation barriers between active regions in an integrated circuit. See, e.g., H. B. Pogge, "Process of Forming Recessed Dielectric Regions In A Monocrystalline Silicon Substrate", U.S. Pat. No. 4,307,180; A. Muramatsa, "Method of Manufacturing A Semiconductor Device Utilizing Etch and Refill To Form Isolation Regions", U.S. Pat. No. 4,369,565; or C. T. Horng et al., "Process for Fabricating A Self-Aligned Micrometer Bipolar Transistor Device", U.S. Pat. No. 4,333,227.

Since bipolar devices typically have a vertical structure and require isolation down to the interface of the epitaxial layer with the substrate, isolation slots may need to be as deep as 5–7 microns. For MOS devices, which have a horizontal orientation and operate on surface conduction principles, slots for isolating MOS devices may be much shallower. As a consequence, to isolate p-wells or n-wells in CMOS devices, the slot need only be on the order of 3 microns deep. To isolate against unwanted surface inversion between adjacent devices of the same type the slots need only be about 1 micron deep.

For CMOS devices generally, and particularly for highly integrated CMOS devices, it has been necessary to provide isolation to prevent latchup. The phenomenon is based upon the parasitic bipolar transistors which are formed inherently by the various physical regions which make up the CMOS devices. These transistors are superimposed upon the n-channel and p-channel devices present in the CMOS structure. Upon the occurrence of certain operating conditions they may latch up the device and impede the operation of the CMOS circuitry. See, e.g., B. L. Gregory et al., "Latchup in CMOS Integrated Circuits", *IEEE Transactions on Nuclear Science*, v. NS20, pp. 293–299 (1973). This phenomenon can be understood by reference to FIGS. 1, 1*a* and 1*b*. In FIG. 1 a typical CMOS structure is shown which has a p-channel device 10 formed in an n-type substrate 18 and an n-channel device 11 formed in a p-well 19. The parasitic devices can be seen by connecting a phantom terminal A to drain region 14 of the p-channel device 10 and a phantom terminal B to the source region 15 of the n-channel device 11. The parasitic SCR as shown in FIG. 1*a* or the two connected parasitic bipolar transistors as shown in FIG. 1*b* are inherently formed. When these devices latch up the CMOS circuit is rendered dysfunctional. To avoid latchup it has been proposed, as shown in FIG. 2, to incorporate n+ region 26 between p+ drain region 14 of p-channel device 10 and p-well 19 and also to incorporate p+ region 27 between n+ source region 15 of n-channel device 11 and n-substrate 18. Such a solution is not acceptable for high density CMOS circuits since too much additional area is dedicated to solving the latchup problem. Another approach is to employ circuit techniques which work against latchup such as using a charge pump to bias the substrate. See, e.g., *Electronics*, Feb. 23, 1984, p. 54. This approach adds undesired complexity and may require the use of proprietary circuit technology. Oxide isolation, of the type shown in FIG. 3, has been utilized for field isolation of CMOS integrated circuits. By definition, field oxide isolation means isolating devices by growing thick field oxide 30, 31, 32 between these devices. This has proven to be generally satisfactory for devices of medium scale integration. However, for large scale integration (LSI) and very large scale integration (VLSI), oxide isolation has occupied an undesirably large amount of the available surface area. It is therefore desirable to be able to provide an isolation technique which will prevent latchup and may be used to isolate wells from substrate regions but which does not require too much additional area or an appreciable amount of additional processing.

In principle, the use of narrow isolation slots will allow high level integration to be accomplished. With the availability of dry etching equipment, slots as narrow as one micron can be fabricated. However, as slots become progressively more narrow, especially for n-channel devices, the likelihood of spurious conduction or inversion occurring across the mouth of the slot becomes more likely due to the positive charge on the surface of the slot. To prevent such inversion, stopper regions have been proposed adjacent the edges of the mouth of the slot. Conventional slot formation techniques, however, tend to undercut the masking layers which define the slot and eat into these stopper regions, thereby making inversion more likely.

It is therefore an object of the present invention to provide a process for fabricating isolation slots for device isolation in integrated circuits which have an immunity to surface inversion.

It is another object of the present invention to provide a process for fabricating isolation slots which does not require inordinately high implantation dosages or a long drive-in in order to dope the stopper regions that serve to impede inversion across the mouths of the filled slots.

It is another object of the present invention to provide a process which prevents the undercutting of the semiconductor substrate underneath the mask adjacent the mouth of the slot.

BRIEF DESCRIPTION OF THE DRAWINGS

For a more complete understanding of the process of the present invention, reference may be had to the accompanying drawings which are incorporated herein by reference and in which:

FIGS. 6–12 illustrate a series of conventional process steps for forming inversion stopper regions before formation of a groove or slot in which undercutting impairs the inversion stopper regions and in which:

FIG. 6 shows the cross-section of a semiconductor substrate having overlying layers of barrier oxide, silicon nitride, vapor deposited oxide and patterned photoresist;

FIG. 7 shows the slot region to be fully defined down to the exposed surface of the substrate and the implantation of p-type dopants;

FIG. 8 shows the p+ region which is formed when the p-type dopants are thermally driven in;

FIG. 9 is a cross-sectional view of FIG. 8 after the partial masking of the groove and the implantation of n-type dopants;

FIG. 10 is a cross-sectional view of FIG. 9 after the n-type dopants are thermally driven in;

FIG. 11 is a cross-sectional view of FIG. 10 after a hypothetical groove formation process and oxide etch which leaves substantial inversion stopper regions;

FIG. 12 is a cross-sectional view of FIG. 10 after a groove has been formed by reactive ion etching and miniscule inversion stopper regions are retained;

FIGS. 13–16 illustrate the use of an idealized groove and FIGS. 17–18 illustrate the use of a groove with undercutting of the silicon sidewall;

FIGS. 19–21 illustrate the process of the present invention for forming inversion stopper regions before a groove is formed in which:

FIG. 19 shows the cross-sectional view of FIG. 10 after the application of a uniform layer of a spacer material;

FIG. 20 is a cross-sectional view of FIG. 19 after the spacer material has been etched away over the exposed silicon in the groove region;

FIG. 21 is a cross-sectional view of FIG. 20 after a groove has been formed;

FIGS. 23–28 are a series of cross-sectional views showing the process of the present invention for forming inversion stopper regions after a groove is formed in which:

FIG. 23 shows a uniform layer of a spacer material in and around a defined groove opening;

FIG. 24 is a cross-sectional view of FIG. 23 after a groove has been formed;

FIG. 25 is a cross-sectional view of FIG. 24 after the removal of one spacer by photo-masking, partial masking and the implantation of p-type dopants;

FIG. 26 is a cross-sectional view of FIG. 25 after the removal of the other spacer, partial masking and the implantation of n-type dopants; and FIG. 27 is a cross-sectional view of FIG. 26 after the thermal drive-in of the implanted dopants and filling the groove.

SUMMARY OF THE INVENTION

A process for forming isolation slots having immunity to surface inversion comprises the steps of defining a slot region in a semiconductor substrate, implanting dopants in the substrate adjacent the mouth of the slot which have conductivity types appropriate to counteract inversion across the slot when filled, applying a spacer layer over the exposed surface of said defined slot region and said substrate, etching said spacer layer to leave spacers only along the edges of the materials defining the slots and etching said substrate to form the slots.

DESCRIPTION OF THE PREFERRED EMBODIMENTS

Figure 1:
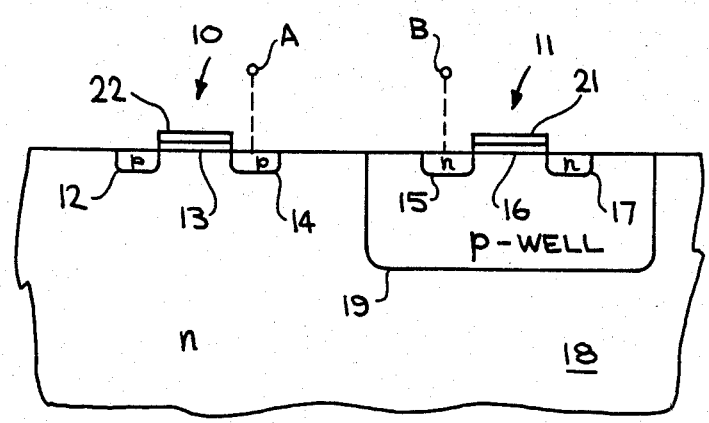
FIG. 1 is a cross-sectional view of a conventional CMOS structure.
Figure 1A:
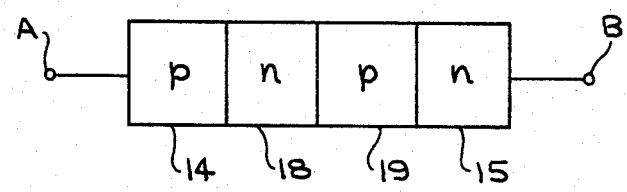
FIG. 1a is a pictorial representation of a parasitic SCR device potentially superimposed on the CMOS structure of FIG. 1.
Figure 1B:
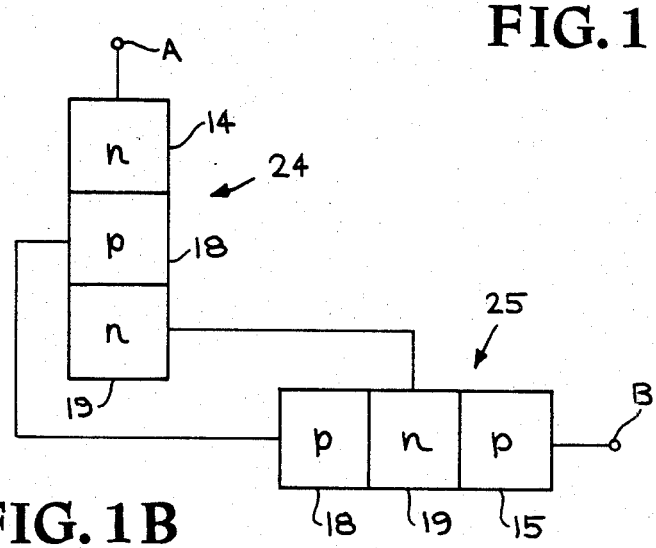
FIG. 1b is a pictorial representation of two bipolar parasitic transistors which are potentially superimposed on the CMOS structure of FIG. 1.
Figure 2:
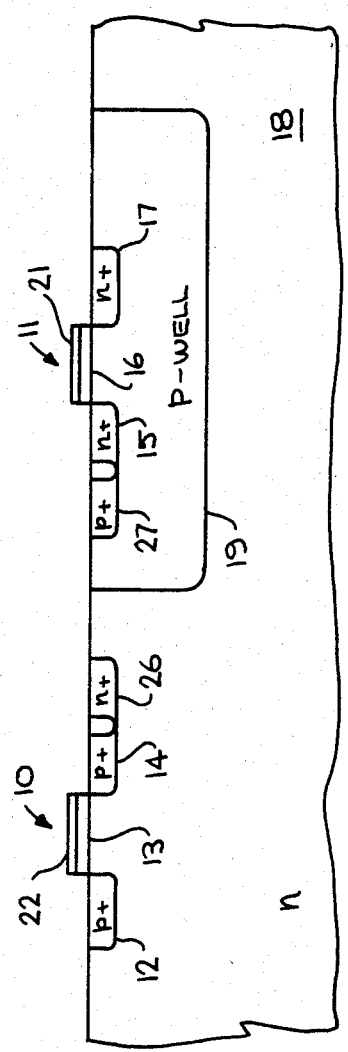
FIG. 2 is a cross-sectional view of a CMOS structure provided with doped buffer regions to prevent latchup.
Figure 3:
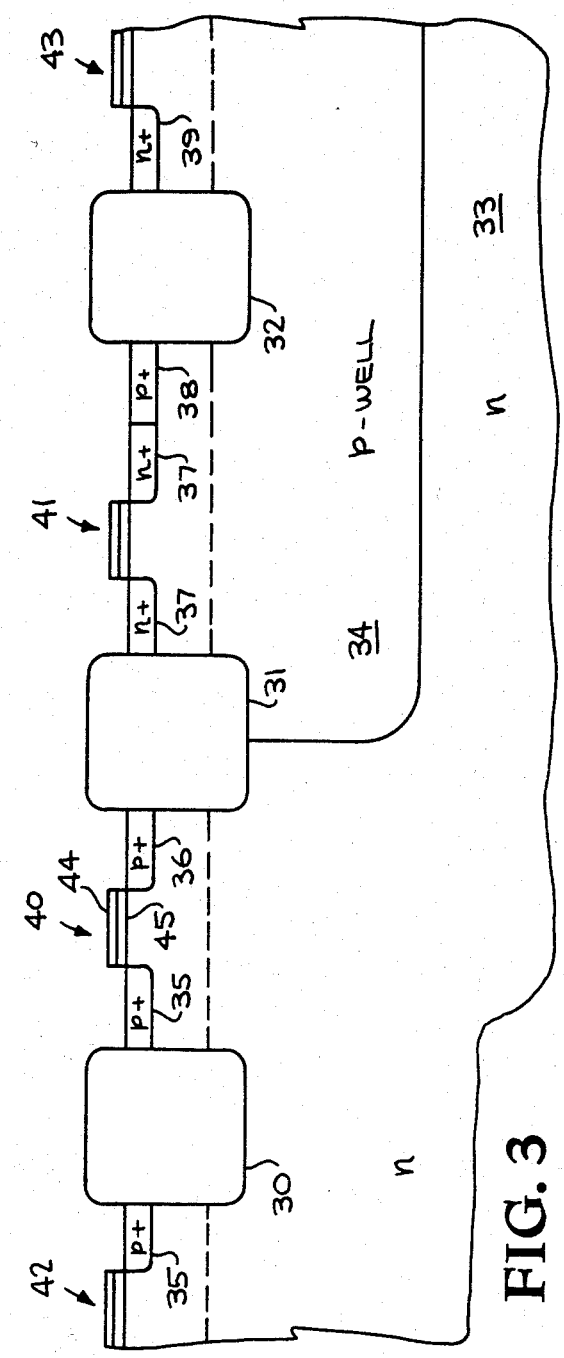
FIG. 3 is a CMOS structure incorporating oxide isolation to separate a p-well from an n-type substrate and to separate individual MOS devices.
Figure 4:
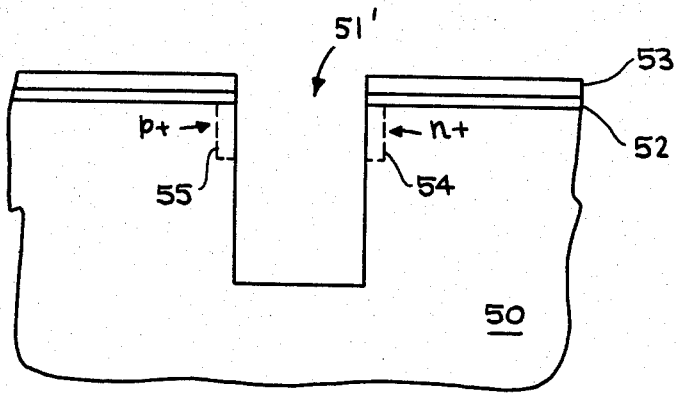
FIG. 4 is a cross-sectional view of an idealized slot formed in the surface of a silicon substrate which would be suitable for isolating individual MOS devices and which includes stopper regions of both conductivity types.

It has been proposed to utilize slots to both isolate individual devices within separate portions of a CMOS integrated circuit and to provide field isolation. Since MOS devices operate on the basis of surface effects, the regions which require electrical isolation are located on the surface of the semiconductor substrate at depths typically on the order of 0.5 microns or less; thus, the slots need only be on the order of 1 micron deep to isolate individual MOS devices or on the order of about 3 microns deep to accomplish field isolation of CMOS wells, for instance. See, e.g., S. Y. Chiang et al., "Trench Isolation Technology For MOS Applications", *Extended Abstracts, Electrochemical Society Meeting,* October 1982, p. 276. An enlarged groove of this type is shown in FIG. 4. The width of groove 51 will typically be on the order of 1 or 2 microns, much less than the thickness of oxide isolation regions 30, 31 or 32 in FIG. 3 or the width required by structural regions 26 and 27 shown in FIG. 2. The grooves will be as narrow as allowed by the resolution of the lithographic technique and the capabilities of the available fabrication processes and as narrow as can be conveniently filled. It is known to use optical lithography, reactive ion beam etching and to fill the slots by conformal isotropic deposition methods such as chemical vapor deposition, as described in the Background section.

Figure 5:
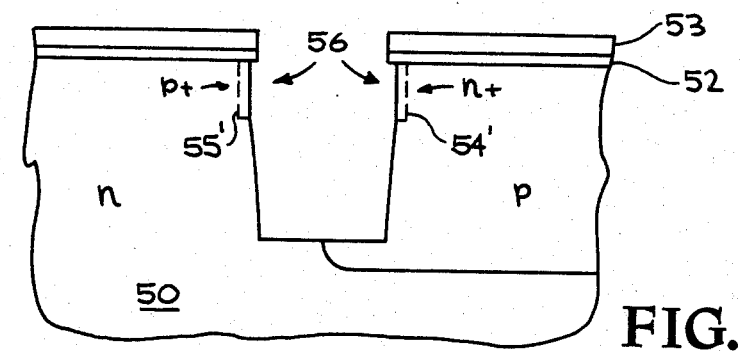
FIG. 5 is a cross-sectional view of a slot formed by a conventional reactive ion etch process which illustrates the undercutting that occurs in the semiconductor substrate near the mouth of the slot.

Since the purpose of the slots is to electrically isolate distinct regions in the substrate, it is essential that there be no electrical conduction through the groove, around its inner surface or across the surface of the filled groove. And, since the electrical activity within CMOS devices occurs in surface inversion channels, it is electrical conduction or leakage at the surface that is especially pernicious. This leakage, called inversion, must be avoided along the surface of the filled groove. It is thus proposed to use an implanted stopper region 54 of n+ type material adjacent the p-well and a p+ type stopper region 55 adjacent the n-type substrate. Analogous stopper regions would be used for an n-well in a p-type substrate. The stopper region may be formed either before or after the formation of the groove. The doping level is sufficient to overcome any spurious conduction across the filled groove so that the groove in fact accomplishes an isolation function. The stopper region is shown to be formed before the formation of the slot, in FIGS. 6-12, and after the formation of the slot, in FIGS. 13-18. The formation of the stopper regions is impeded because, in practice, the sidewalls of the groove experience unwanted etching near the mouth, i.e., the substrate experiences some undercutting adjacent the mouth of the groove. This occurs because the upper edges experience a measure of abrasive action from the reactive ion beam, even though it is a downwardly directed beam, as the middle and lower regions of the groove are being formed. The lateral component of etching thus eats into the upper sidewall and reduces the size of stopper regions 54 and 55, leaving the residual regions 54' and 55' shown in FIG. 5. When undercutting is experienced it is necessary to use either higher implant doses or longer implant drive-in times in order to ensure that the residual inversion stopper regions will have a high enough conductivity level or be of sufficient size to prevent inversion across the surface of the groove. These criteria are discussed in detail subsequently with respect to the conventional processes for forming slots and inversion stopper regions. The process of the present invention permits the fabrication of narrow grooves with inversion stopper regions adjacent their mouths without requiring such long implant drive-in times or exceptionally high implant dosages.

Figure 6:
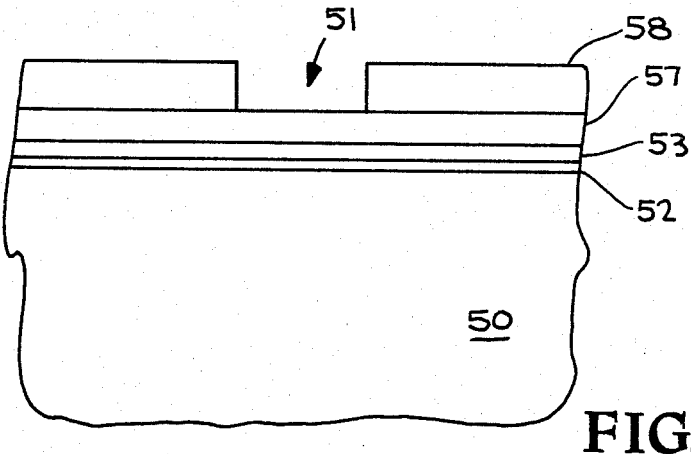
Figure 7:
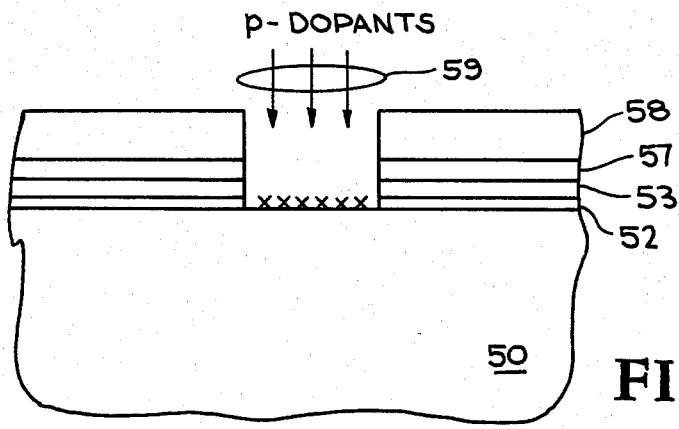
Figure 8:
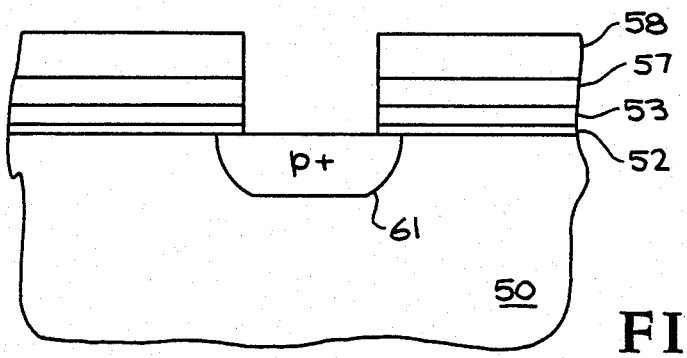
Figure 9:
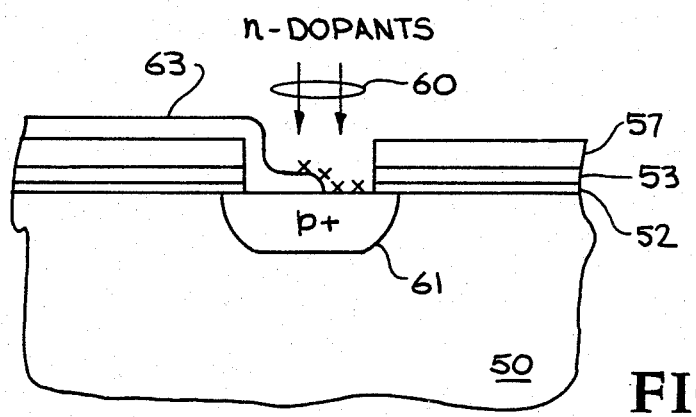
Figure 10:
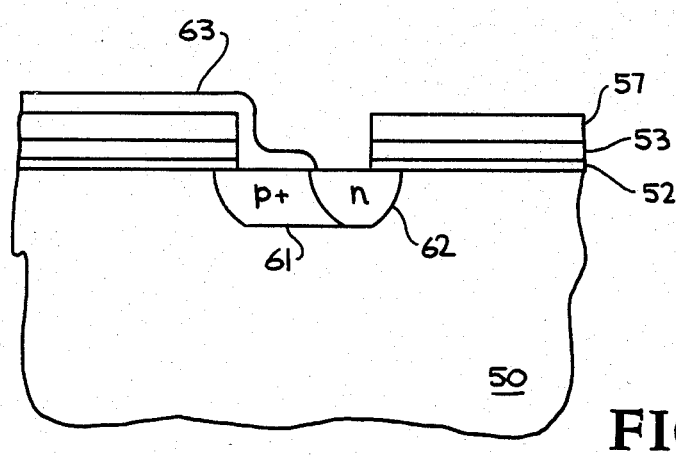
Figure 11:
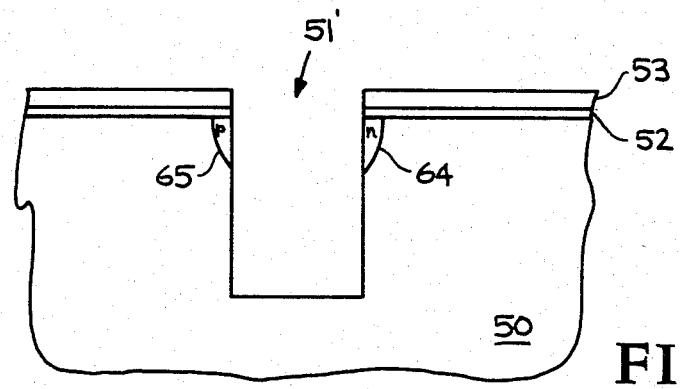
Figure 12:
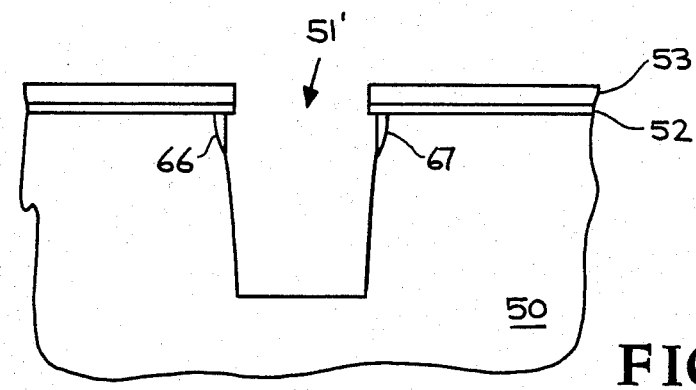
Figure 13:
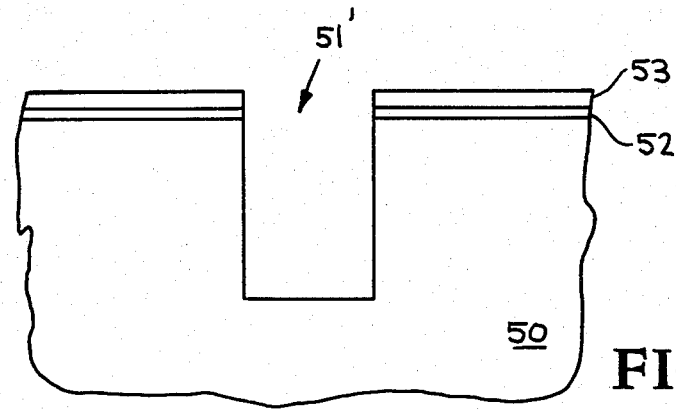
FIGS. 13–18 illustrate a series of conventional process steps in which inversion stopper regions are formed after formation of a groove and in which in particular.
Figure 14:
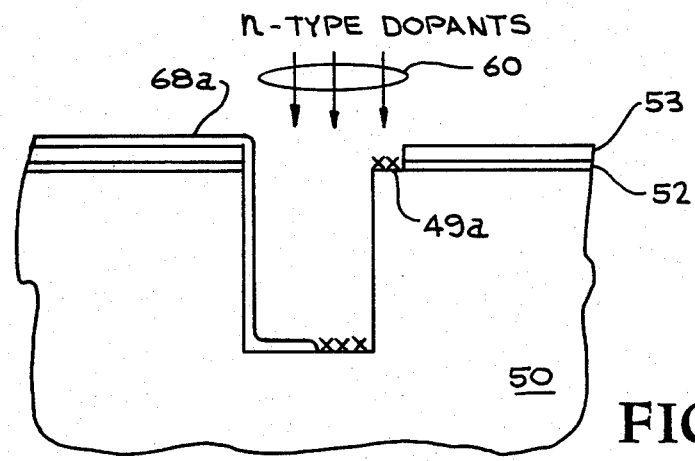

A conventional process sequence for forming stopper regions before the formation of a groove is shown in FIGS. 6-12. In FIG. 6 a semiconductor substrate 50 is shown with an overlying layer 52 of a barrier oxide, a layer 53 of silicon nitride, layer 57 of CVD oxide and a patterned photoresist mask 58. The barrier oxide layer 52 serves to reduce the stress between nitride and silicon during oxidation. The silicon nitride layer 53 serves to mask the source drain area during oxidation during later processing. And the CVD oxide layer 57 serves to mask the silicon groove etching. Variations of this layering scheme may be used. The pattern of the photoresist mask 58 defines the groove regions 51. As shown in FIG. 7, the photoresist layer 58 serves as a mask to permit the etching of the layers 52, 53 and 57 down to the surface of silicon substrate 50. Then, a p-type dopant 59 is implanted onto the exposed surface of silicon substrate 50, typically at low energies on the order of 50 kev for shallow stops or a combination of different energy implants can be conducted for deeper channel stops. A thermal drive-in step is carried out by conventional means, as shown in FIG. 8, to produce the p+ diffused region 61. A portion of this p+ diffused region 61 will serve as a p+ stopper against the inversion from an n-type substrate. For simple structures a stopeer of one conductivity type may be all that is required, for instance, to isolate n-channel devices. However, to show the general case, the process sequence covers the formation of stopper regions of both p- and n-type conductivities. Thus, a masking layer 63 such as a CVD deposited layer of silicon dioxide or photoresist is applied in FIG. 9 to cover a portion of the groove region 51 over p+ diffused region 61. Then, n-type dopants 60 are implanted onto the yet exposed surface of substrate 50. In a thermal drive-in step, the n-type dopants are driven in through the exposed silicon surface to produce n-type region 62 superimposed upon p+ region 61 as shown in FIG. 10. FIGS. 11 and 12 show the idealized and the real resulting structure, respectively, once a groove 51' is formed in the silicon substrate, typically by a directed ion beam process such as reactive ion etching. Ideally, as shown in FIG. 11, one would desire to have vertical sidewalls near the surface which are in precise alignment with the edges of the masking layers 57, 53 and 52. This would leave p-type stopper region 65 adjacent one side of the mouth of slot 51' and n-type stopper region 64 in the silicon substrate adjacent the other side of the mouth of silicon substrate 50. In practice, as described previously, as the middle and bottom portions of the slot 51' are being formed, the lateral component of the reactive ion etching process undercuts some of the edges of the layers 53, 52, as shown in FIG. 12, and eats into the silicon substrate 50. As a consequence, the stopper regions 65 and 64 are partially consumed, leaving the residual p-type stopper region 66 and the residual n-type stopper region 67. Depending upon the severity of the undercutting, the stopper regions will be more or less effective in preventing inversion in the filled slot. The worst case would be that the stopper regions are entirely consumed so that no protection is provided against inversion.

Figure 15:
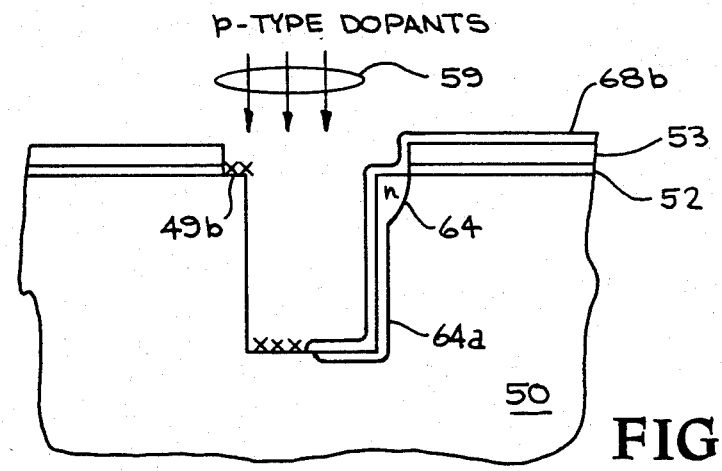
Figure 16:
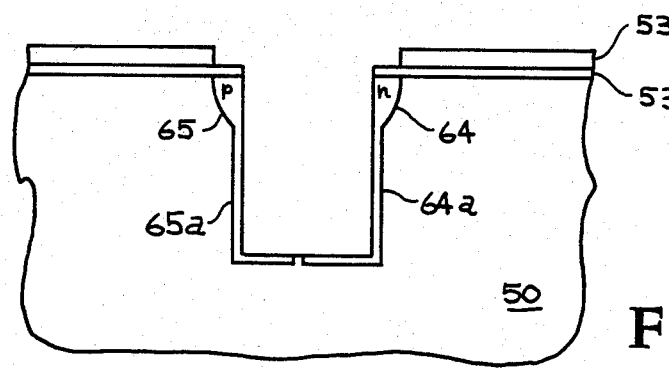
Figure 17:
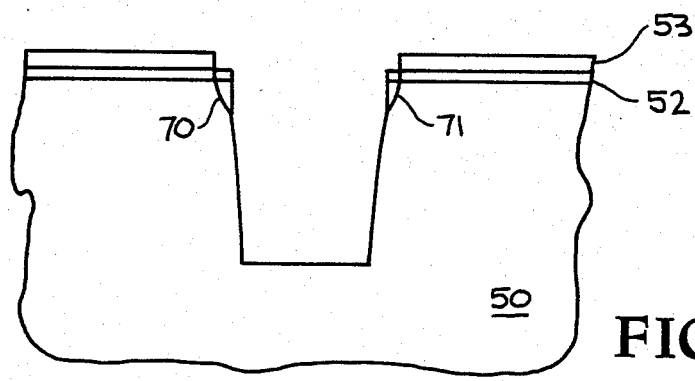
Figure 18:
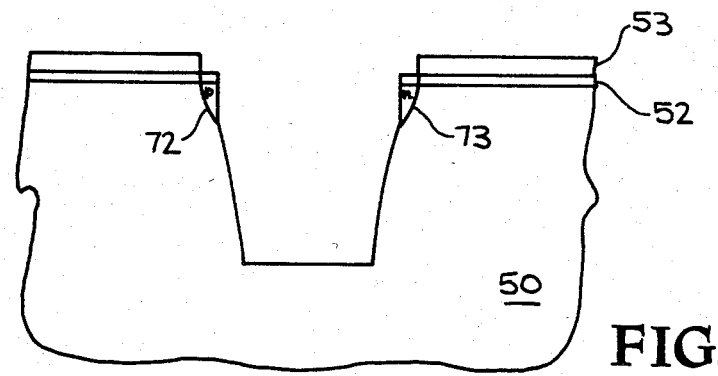
Figure 19:
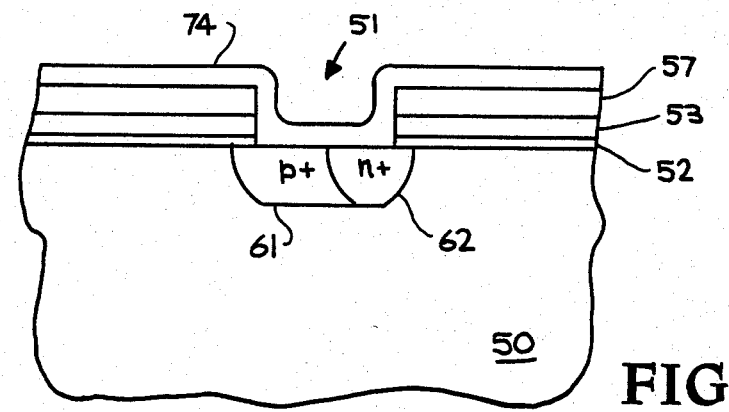
Figure 20:
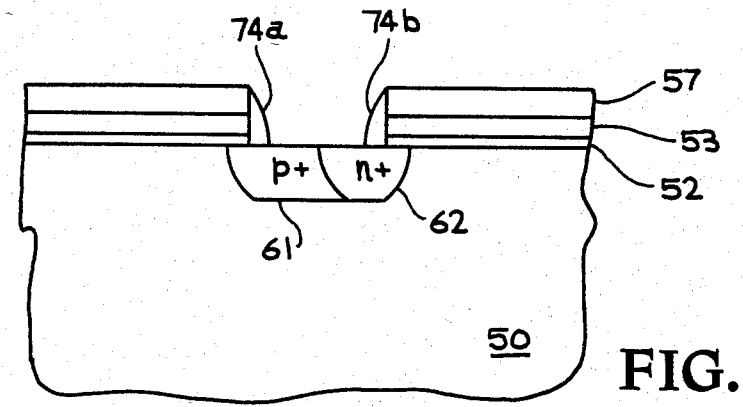

A conventional process sequence for forming stopper regions after the groove has been formed is shown in FIGS. 13–18. In FIG. 15 the fully formed groove 51' is shown. It is shown as an idealized structure for purposes of illustrating the sequence. The final result, of course, will not be the idealized result of FIG. 16 but rather will be a result comparable to the structure shown in FIGS. 17 or 18. In the idealized sequence, to produce an n-type stopper region, the edge of barrier oxide layer 52 and silicon nitride layer 53 is etched away leaving a ledge 49a of exposed silicon. A masking layer such as CVD silicon dioxide 68a is applied to cover the opposite side of the groove. Then, n-type dopants 60 are implanted onto the surface of ledge 49a and onto the exposed region at the bottom of the slot 51'. A short thermal drive-in step suffices to produce the n-type stopper region 64. Some n-type dopants are also implanted and driven into the sidewalls and bottom of the slot as shown by region 64a; this is useful to prevent inversion along the contour of the slot. Then, as shown in FIG. 15, the masking layer 68a is removed and a complementary masking layer 68b is applied to the portion of the groove and over the ledge 49a to which n-type dopants previously were applied. Portions of barrier oxide layer 52 and silicon nitride layer 53 are removed to expose the ledge 49b. Then, p-type dopants 59 are implanted onto the ledge 49b and into the exposed regions of groove 51'. A short thermal drive-in step serves to produce p-type stopper region 65 underneath ledge 49b. Some of the p-type dopants are also implanted and driven in along the side and at the bottom of the slot as shown by region 65a in FIG. 16. Barrier oxide layer 52 can be restored over the stopper regions 64, 65 to produce the structure shown in FIG. 16. This structure may be filled with suitable filler material to serve as an isolation slot. Suitable filler materials will be materials such as polycrystalline silicon, silicon dioxide, polyimide or like materials. Polycrystalline silicon is preferred because it has a coefficient of thermal expansion comparable to the substrate. In practice, the structure of FIG. 17 is realized rather than the idealized structure of FIG. 16 due to the undercutting of the silicon sidewalls. Thus, instead of the substantial n-type stopper region 64 and the substantial p-type stopper region 65, one obtains a smaller n-type stopper region 71 and p-type stopper region 70 and only minor implanted dopants along the sidewalls, for a given lateral expanse for the shelf regions 49a and 49b. The resultant stopper regions may not contain sufficiently high dopant levels or be of sufficient size to adequately prevent inversion across an isolation slot. By increasing the lateral expanse of shelf regions 49a and 49b it is possible to produce stopper regions 72 and 73, shown in FIG. 18 which even after undercutting would prevent inversion. Unfortunately, this practice consumes significant additional area on the surface of the semiconductor substrate 50 and mitigates against high density integrated circuits.

Figure 21:
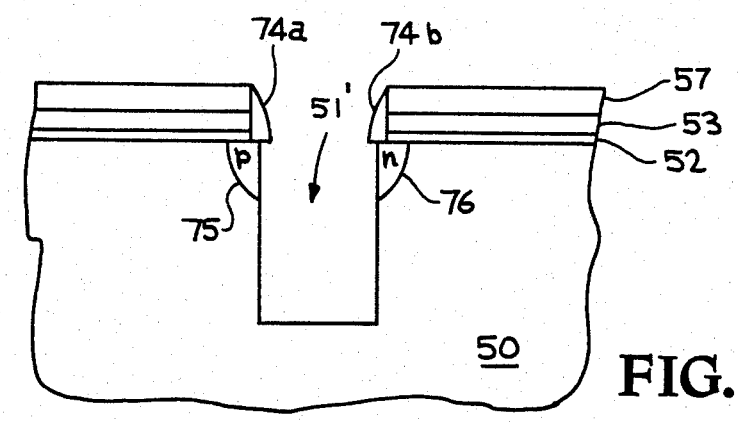
Figure 22:
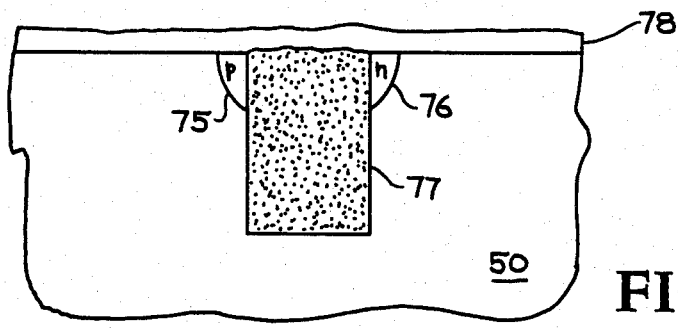
FIG. 22 is a cross-sectional view of FIG. 21 after the groove has been filled and the semiconductor surface has been passivated.

The process of the present invention allows the fabrication of adequate inversion stopper regions with minimal consumption of silicon surface area. The present invention may be practiced before of after the formation of the groove. In FIGS. 19–22 a process sequence is illustrated in which the present invention is practiced before the groove is formed. In FIGS. 23–28 a process sequence is shown in which the present invention is practiced after a groove has been formed. The fabrication process of the present invention is shown to begin after the existence of p+-type diffused region 61 and n-type diffused region 62, as shown to be completed by the prior art process of FIG. 10. At this stage, a layer of spacer material 74 is uniformly applied over the surface of deposit oxide layer 57 and is allowed to flow into or to be grown onto the surfaces of the slot region 51. Since an isotropic process is preferably used, the exposed surface of semiconductor substrate 50 as well as the edges of layers 57, 53 and 52, are covered by the spacer material to a uniform depth. The spacer material is preferaby a CVD silicon dioxide. A directed etching process such as reactive ion etching is used to remove the horizontally disposed portions of spacer layer 74. As a consequence, spacers 74a and 74b are left, respectively, on the left and right-hand edges of the layers 57, 53 and 52. The upper ends of the spacers 74a and 74b will be rounded due to the abrasive action of the directed ion beam process. However, a substantial amount of the thickness of the layer will remain at least where it overlies the substrate. Then, as shown in FIG. 21, the groove 51' is formed. Due to the presence of spacers 74a and 74b, even when undercutting occurs a substantial n-type inversion stopper region 76 and a substantial p-type inversion stopper region 75 remain in the structure. Thus, as shown in FIG. 21, the spacers 74a and 74b extend over the actual edge of the silicon sidewall but the edge of the silicon sidewall is at least at the line of the original edge of layers 57, 53 and 52 and may extend outward, depending upon the thickness of the spacers 74a and 74b. When the spacers and overlying layers are removed, the slots filled with filler material 77 and the passivation layer 78 applied, as shown in FIG. 22, the substantial inversion stopper regions 75 and 76 will prevent inversion across the top of the filled slot.

Figure 23:
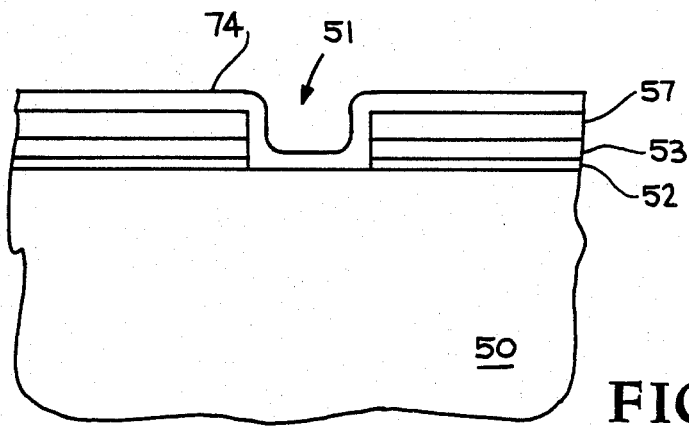
Figure 24:
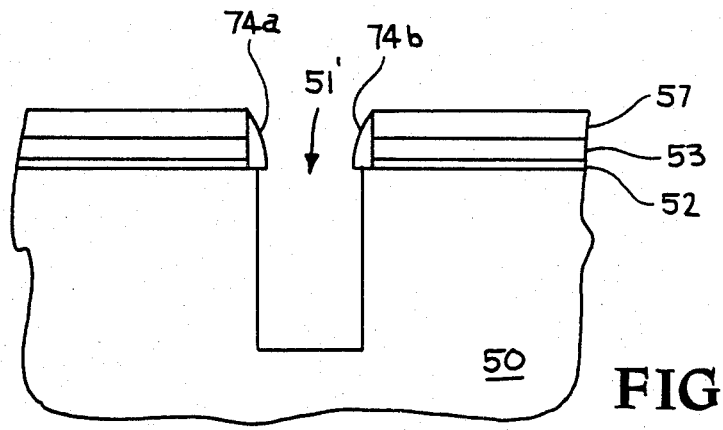
Figure 25:
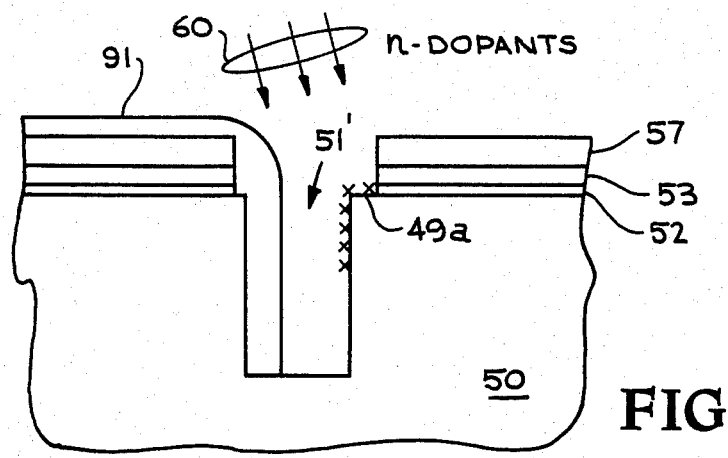
Figure 26:
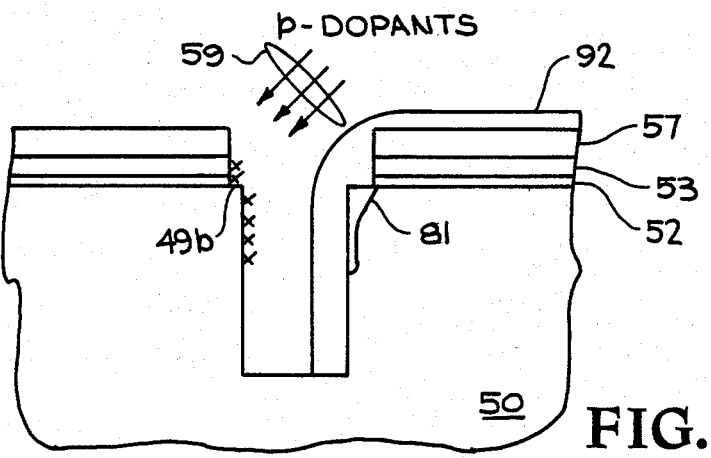
Figure 27:
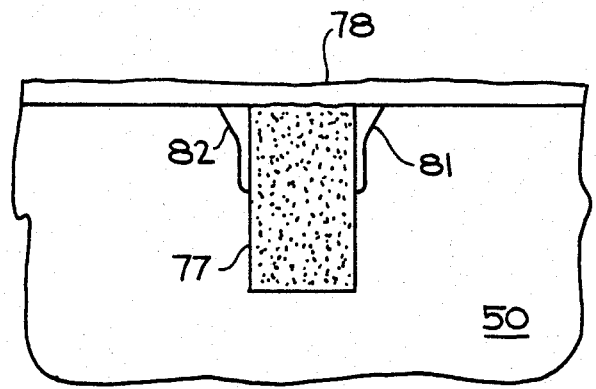

The process sequence of FIGS. 23–28 illustrates the fabrication process of the present invention as applied after the fabrication of a groove. In FIG. 23 a defined groove region 51 is shown to be bordered by barrier oxide layer 52, silicon nitride layer 53, and CVD oxide layer 57. This is the same structure as shown in the prior art process sequence of FIG. 7. However, before the groove is formed, a spacer layer 74 has been applied over the surface of layers 57, 53 and 52 and on the exposed surface of silicon substrate 50. As before, with reference to FIG. 20, and now as shown in FIG. 24, spacer layer 74 is removed by a downwardly directed ion beam process wherever it is horizontally disposed. Thus, spacers 74a and 74b are left adjacent the edges of layers 57, 53 and 52. Then, also as shown in FIG. 24, the groove 51' is formed. The edges of the groove will be no further in than the original edges of layers 57, 53 and 52 and may extend outward beyond them. This occurs even though there is undercutting behind the edge of spacers 74a and 74b. Next, as shown in FIG. 25, when spacer region 74b is removed and the edges of barrier layer 52, silicon nitride layer 53, and CVD layer 57 are removed, ledge 49a is opened up and has a greater open area for the same lateral expanse. By using resist mask 91, or other means, n-type dopants 60 are implanted on ledge 49a and along a portion of the associated sidewall of the slot. After thermal drive-in, the n-type stopper region 81 is formed as well as an n-type layer along a portion of the associated sidewall. Finally, using resist mask 92, p-type dopants are implanted onto the complementary ledge 49b and along its associated sidewall. After thermal drive-in the p-type stopper region 82 is formed. When the slot is filled by filler material 77 and a passivation layer 78 is applied, a slot having immunity to isolation is formed, as shown in FIG. 27.

The foregoing description of a preferred embodiment of the invention has been presented for purposes of illustration and description. It is not intended to be exhaustive or to limit the invention to the precise form disclosed, and obviously many modifications and variations are possible in light of the above teaching. For example, the slot and stopper formation processes may be extended to a range of III–V compounds by using comparable effective spacer layers, dopants and etching techniques. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A process for fabricating slots in semiconductor substrates which slots have inversion stoppers adjacent the mouths of the slots, comprising the steps of:
    applying at least one overlying layer to said substrate to define a region in which a slot is to be formed;
    patterning said at least one layer to define a slot region to be formed;
    forming a spacer on the surface of said substrate adjacent the edge of said at least one layer that defines whenever said inversion stopper regions are to be formed;
    forming an inversion stopper of one conductivity type in said substrate adjacent said mouth of said slot around at least a portion of the periphery of said slot, said one conductivity type being the opposite conductivity type to the conductivity type of said substrate adjacent said stopper; and
    forming said slot by a directed beam process whereby said spacer serves to impede the undercutting of said at least one layer and thereby retains the original extent of said inversion stopper region.

2. A process for fabricating slots in accordance with claim 1 wherein said step of forming a spacer on the surface of said substrate is accomplished by the step of forming a spacer on the surface of said substrate before the formation of a slot in said substrate.

3. A process for fabricating slots in accordance with claim 1 wherein said step of forming a spacer on the surface of said substrate is accomplished by the step of forming a spacer on the surface of said substrate after the formation of a slot.

4. A process for fabricating slots in accordance with claims 1, 2 or 3, wherein said step of forming a spacer is accomplished by the steps of:
    applying a layer of a spacer material essentially uniformly over the surface of said semiconductor substrate and said at least one overlying layer, said layer of spacer material covering the edges of said at least one overlying layer; and
    etching all horizontally disposed regions of said spacer layer.

5. A process for fabricating slots in accordance with claim 4 wherein said step of etching all horizontally disposed regions is accomplished by the step of applying a directed reactive ion beam downwardly onto said substrate.

6. A process for fabricating slots in accordance with claim 5 wherein said step of forming an inversion stopper layer is accomplished by the step of:
    implanting ions into said substrate to produce a region of an appropriate conductivity type.

* * * * *